(12) United States Patent
Puma et al.

(10) Patent No.: US 7,385,404 B2
(45) Date of Patent: Jun. 10, 2008

(54) ARRANGEMENT AND METHOD FOR TESTING A CAPACITANCE ARRAY IN AN INTEGRATED CIRCUIT

(75) Inventors: Giuseppe Li Puma, Bochum (DE);
Duyen Pham-Städner, Ratingen (DE);
Elmar Wagner, Duisburg (DE)

(73) Assignee: Infineon Technologies AG, Munich (DE)

( * ) Notice: Subject to any disclaimer, the term of this patent is extended or adjusted under 35 U.S.C. 154(b) by 370 days.

(21) Appl. No.: 10/941,428

(22) Filed: Sep. 15, 2004

(65) Prior Publication Data
US 2005/0099198 A1 May 12, 2005

(30) Foreign Application Priority Data
Sep. 15, 2003 (DE) .............................. 103 42 472

(51) Int. Cl.
  *G01R 31/12* (2006.01)
  *G01R 27/26* (2006.01)
(52) U.S. Cl. .................................. 324/548; 324/678
(58) Field of Classification Search ............. 324/548
See application file for complete search history.

(56) References Cited

U.S. PATENT DOCUMENTS

| | | | | |
|---|---|---|---|---|
| 5,461,321 A | * | 10/1995 | Sanders et al. ............. | 324/678 |
| 5,502,375 A | * | 3/1996 | Marek ......................... | 324/133 |
| 5,508,700 A | * | 4/1996 | Taylor et al. ................. | 341/33 |
| 5,585,733 A | * | 12/1996 | Paglione ..................... | 324/678 |
| 6,191,723 B1 | * | 2/2001 | Lewis ......................... | 341/166 |
| 6,275,047 B1 | * | 8/2001 | Zoellick et al. ............. | 324/678 |
| 7,145,350 B2 | * | 12/2006 | Mellert et al. .............. | 324/678 |
| 2005/0270042 A1 | * | 12/2005 | Doljack ...................... | 324/686 |

FOREIGN PATENT DOCUMENTS

DE  43 40 472 C1  4/1995

* cited by examiner

*Primary Examiner*—Andrew H Hirshfeld
*Assistant Examiner*—Jeff Natalini
(74) *Attorney, Agent, or Firm*—Eschweiler & Associates, LLC

(57) ABSTRACT

An arrangement for testing a plurality of capacitances in a capacitance array of an integrated circuit includes a power supply and a means for cyclically charging and discharging at least one of the capacitances. In this arrangement, the cycle frequency is dependent on the value of the capacitance. The cycle frequency or a quantity characteristic associated therewith is measured by a means to ascertain a value of the capacitance under test.

19 Claims, 1 Drawing Sheet

ARRANGEMENT AND METHOD FOR TESTING A CAPACITANCE ARRAY IN AN INTEGRATED CIRCUIT

REFERENCE TO RELATED APPLICATIONS

This application claims the benefit of the priority date of German application DE 103 42 472.5, filed on Sep. 15, 2003, the contents of which are herein incorporated by reference in their entirety.

FIELD OF THE INVENTION

The invention relates to an arrangement and a method for testing a capacitance array in an integrated circuit.

BACKGROUND OF THE INVENTION

Using capacitance arrays in integrated circuits is already known and has been implemented in a number of different circuits. Examples of such integrated circuits with capacitance arrays are digital/analogue converters or tuneable crystal oscillators.

Previously, the capacitance arrays contained in the integrated circuits have been tested mainly by analogue means, e.g. in such a manner that a voltage or current measurement is used for checking whether there is a short circuit between the capacitor plates of the individual capacitances in the capacitance array. As a rule, these tests provide information only on whether the capacitance tested is defective or operable. This method does not provide accurate quantitative information about the value of the capacitance tested. This is a disadvantage particularly when testing weighted capacitance arrays since the usefulness of the circuit utilizing the capacitance array, e.g. digital/analogue converter or crystal oscillator circuit, depends substantially on the required capacitance values in the capacitance array being maintained.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention is directed to an arrangement and a method for testing a capacitance array in an integrated circuit that can determine the values of the individual capacitances with high accuracy. In one example, the arrangement and the method are of such a nature that they are implemented as fully automatic built-in self test (BIST).

According to one aspect of the present invention, the arrangement for testing a capacitance array comprising a plurality of capacitances in an integrated circuit comprises a power supply that feeds a means for cyclically charging and discharging at least one of the capacitances in the capacitance array. The frequency of the cycle is dependent on the value of the capacitance tested. A means for measuring the cycle frequency or a quantity influenced by it enables the value of the measured capacitance to be assessed so that it is possible to determine whether the capacitance value has a predetermined value or, respectively, lies within a predetermined tolerance range.

The invention based on the principle of capacitance frequency conversion provides for accurate measurement of capacitance values as a result of which monotonicity errors and/or nonlinearity errors of the capacitance values can be detected and used, for example, for determining the characteristic of a digital/analogue converter. Furthermore, the invention has the advantage that it can be implemented in digital circuit technology and thus provides good preconditions for its implementation as BIST.

The means for cyclically charging and discharging the capacitance(s), in one example, comprises a comparator for comparing a charging voltage to a reference value, and a first switching means, driven by the comparator output, for discharging the capacitance when the charging voltage has reached the reference value. In this manner, the comparator may operate as a multi-vibrator since the comparator output determines the charging phase (discharging/charging).

In principle, a joint test of a number of capacitances of the capacitance array is possible, this number of capacitances being allocated a common first switching means in this example. However, one advantageous embodiment of the invention is characterized by a first switching means allocated in each case to each capacitance to be tested in the capacitance array, and that the arrangement according to the invention has a de-multiplexer that is provided between the comparator output and the controlled first switching means. By means of this measure, each capacitance of the capacitance array can be tested individually and the individual capacitances can be checked in sequence, controlled by the de-multiplexer. In this manner, a continuous image of the capacitance values of the capacitance array can be obtained.

The means for cyclically charging and discharging the capacitance advantageously comprises a second switching means via which the capacitance can be electrically connected to the power supply and disconnected from it. This second switching means is closed as soon as a test of the corresponding capacitance is to be performed.

The comparator output, in one example, is advantageously electrically connected to an evaluating circuit that performs a counting or frequency evaluation of the signal at the comparator output. For example, signal pulses at the comparator output can be counted over a predetermined period of observation. The count present at the end of the observation period is a measure of the cycle frequency.

The evaluating circuit can also advantageously comprise a memory in which a nominal value, particularly a nominal count or a nominal-value tolerance interval is stored for the at least one capacitance to be tested. A comparing means contained in the evaluating circuit performs a comparison of the nominal value or of the nominal-value interval with the result of the evaluation, obtained during the counting or frequency evaluation. In particular, nominal values or nominal-value intervals can be available in the memory for each capacitance of the capacitance array to be tested.

The arrangement according to one aspect of the invention is constructed with particular advantage as a BIST arrangement in the integrated circuit. This provides for a fully automatic self test of the integrated circuit using the capacitance array. This circuit can be, for example, a digital/analogue converter or an oscillator, particularly a multi-frequency oscillator with tuneable crystal oscillators.

In the manner described above, the method according to the invention provides for a quantitative test of the capacitance values in the capacitance array with high accuracy and information contained. In addition, the method according to the invention also provides for a test of third switching means via which the circuit utilizing the capacitance array is connected to the individual capacitances. In this test, one of the third switching means (namely the one to be tested) is closed. Furthermore, the second switching means is connected to the same capacitance. The first switching means at the same capacitance is opened and a test frequency is applied to the capacitance via the closed third switching means. The signal obtained via the closed second switching means is used for evaluating purposes.

BRIEF DESCRIPTION OF THE DRAWINGS

In the text which follows, the invention is explained by means of an illustrative embodiment and referring to the drawings.

DETAILED DESCRIPTION OF THE INVENTION

Figure 1:
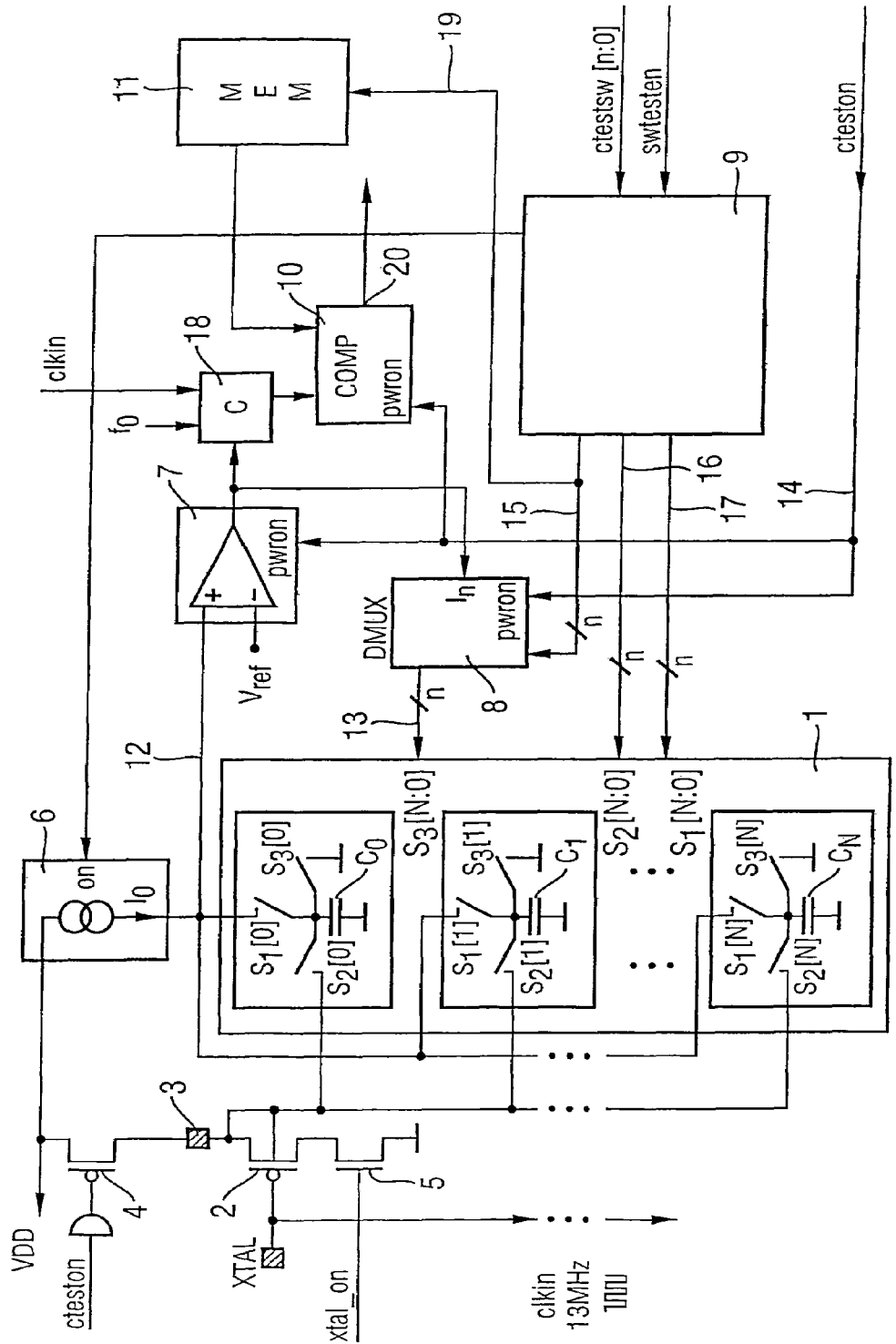
FIG. 1 illustrates a circuit diagram of a tuneable crystal oscillator with a test circuit for testing capacitances in a capacitance array associated therewith according to one aspect of the present invention.

A capacitance array 1 has N capacitances $C_0, C_1, \ldots, C_N$. The capacitances $C_0, C_1, \ldots, C_N$ are in each case connected to earth or ground potential or other predetermined potential with one electrode. The other electrode is connected to respective switches $S_1$ [n], $S_2$ [n], $S_3$ [n], n=0, 1, ..., N and N designating the number of capacitances in the capacitance array 1. In practice, the switches $S_1$ [n], $S_2$ [n], $S_3$ [n] are implemented by means of switching transistors.

The capacitances $C_n$ of the capacitance array 1 can be optionally connected to the oscillator circuit via the switches $S_2$ [n]. The oscillator circuit essentially consists of a field-effect transistor (FET) 2, the drain-source path of which is connected, on the one hand, to the operating voltage VDD via the load input 3 and a switching transistor 4 and, on the other hand, can be connected to earth or ground via a further switching transistor 5.

The gate of the FET 2 is connected to the XTAL input of the crystal oscillator (XTAL-crystal). A signal xtal_on for switching on the oscillator can be applied via the gate of the switching transistor 5. The switching transistor 4 is driven by a signal cteston that activates the capacitance test, described in greater detail in the test which follows.

The test circuit comprises a current source 6, a voltage comparator 7, a counter 18, a de-multiplexer 8, a logic unit 9, a further comparator 10 and a memory 11.

The output of the current source 6 can be connected optionally to the capacitances $C_n$ via the switches $S_1$ [n]. It is also connected to the non-inverting input of the voltage comparator 7 via a line 12. The inverting input of the voltage comparator 7 is connected to a predetermined reference voltage Vref.

The output signal of the voltage comparator 7 is supplied both to the counter 18 and to the signal input of the de-multiplexer 8. The n output signals of the de-multiplexer 8 are supplied to the capacitance array 1 via a control data connection 13 with word width n. The individual bits determine the switching state of the switches $S_3$ [n] of the capacitance array 1. The discharging process of each individual capacitance $C_n$ can thus be started and ended selectively and independently of the switch positions of the switches $S_3$ [n] at other capacitances.

The counter 18 is supplied with a high counting frequency $f_0$. At its reset input, a signal clkin is present. The output of the counter 18 is supplied to a first input of the comparator 10. Via a second input, the comparator 10 can access nominal voltage values for nominal-value intervals stored in the memory 11. To provide for high flexibility of the test circuit, the nominal values (or nominal-value intervals, respectively) should be programmable.

The test activation signal cteston is supplied via a control line 14 to the voltage comparator 7, the de-multiplexer 8 and the comparator 10 via a respective input pwron. If cteston=1, the units are switched on.

The logic circuit 9 is supplied with the signals swtesten and ctestsw [n:0]. The swtesten signal specifies whether a capacitance test (swtesten=0) or a test of the switches $S_2$ [n] (swtesten=1) is to be performed. The respective capacitances or switches $S_2$ [n] to be tested are selected via the programming of ctestsw [n:0].

The logic circuit 9 provides a control signal 15 of word width n for the control input of the de-multiplexer via which, as already mentioned, the switches $S_3$ [n] are addressed. So that the correct nominal value (i.e. that allocated to the capacitance currently tested) is read out in each case, the address decoder of the memory 11 is also connected to the control signal 15 output by the logic circuit 9 via an address data link 19. Furthermore the logic circuit 9 generates a control signal 16 of word width n for controlling the switches $S_2$ [n] and a control signal 17 of word width n for controlling the switches $S_1$ [n].

The test circuit operates as follows:

During the BIST, FET 2 is deactivated via the signal xtal_on=0.

As already mentioned, the test sequences are activated by means of the signal cteston=1. The control signal swtesten is used for selecting whether it is the capacitances $C_n$ or the switches $S_2$ [n] which are to be tested:

1. Testing of the Capacitances $C_n$ (swtesten=0).

To check the capacitances $C_n$, a clock clkin of, for example, 13 MHz is applied to the XTAL input, i.e. to the gate of FET 2. The clock clkin also clocks the logic circuit 9, the de-multiplexer 8 and the address decoder of the memory 11 (in a manner not shown). Furthermore, the clock clkin resets the counter 18, i.e. it specifies the time window within which the pulses at the output of the voltage comparator 7 are counted.

During the test of the capacitances Cn, the switches $S_1$ [n] and $S_3$ [n] are selectively driven by the logic circuit 9. Switch $S_1$ [n] of the capacitance $C_n$ to be tested is closed, the position of the switch $S_3$ [n] is controlled by the control data connection 13. The current source 6 is activated and delivers a constant current I0.

For example, capacitance $C_0$ is to be tested. In a first charging phase, the switch $S_1$ [0] is closed and switch $S_3$ [0] is opened. The capacitance $C_0$ is then charged by the current source 6 until the charging voltage reaches a value Vref. At this instant, the voltage comparator 7 generates the rising edge of a counting pulse which increments the counter 18 and, at the same time, closes the selected switch $S_3$ [0] via the de-multiplexer 8. The capacitance $C_0$ is discharged as a result of which the voltage drops at the non-inverting input of the voltage comparator 7 and the signal value at the output of the voltage comparator changes. This change in signal value ends the counting pulse and opens the switch $S_3$ [0] whereupon a new charging phase begins.

After the period predetermined by the reset clock clkin, the comparator 10 compares the count with the corresponding nominal value (or nominal-value interval) to the capacitance $C_0$. The comparison signal available at the output 20 of the comparator 10 specifies whether the count matches the nominal value within the tolerance limits. If this is so, the capacitance $C_O$ has passed the test, and, if not, the capacitance $C_O$ is considered to be faulty or to be outside the tolerance range.

Controlled by the logic circuit 9, all (or also only a particular group of) capacitances $C_n$ can be checked in this manner in the multiplex cycle clkin. The accuracy of this method depends on the temporal constancy of the value $I_O$ of the charging current. A very high accuracy of the capacitance measurement can be achieved with a current source 6 that generates a stable (temperature-independent, temporally constant) charging current, i.e. by using an external reference.

2. Testing of the Switches $S_2$ [n] (swtesten=1):

The current source 6 is deactivated for testing the switches $S_2$ [n]. An external clock is applied to the input 3 for the load. The switch $S_2$ [n] to be tested and the associated switch $S_1$ [n] are closed so that the external clock is conducted to the non-inverting input of the voltage comparator 7 via line 12. If the switch $S_2$ [n] and the switch $S_1$ [n] are operating correctly, the signal value at the output of the voltage comparator 7 changes in accordance with the external clock. This is determined by means of the counter 18, the comparator 10 and possibly the memory 11 in the manner already described and reported, for example, also via the comparator output 20.

Although the invention has been illustrated and described with respect to one or more implementations, alterations and/or modifications may be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An arrangement for testing a capacitance array comprising:
   a plurality of capacitances;
   a power supply;
   means for cyclically charging and discharging at least one of the capacitances over a predetermined time period, wherein a cycle frequency of the charging and discharging is dependent on a value of the at least one capacitance and a comparison of a charging voltage associated with the at least one capacitance with a reference value; and
   means for measuring the cycle frequency or a quantity associated therewith over the time period, and using the measurement to evaluate the capacitance value of the at least one of the capacitances.

2. The arrangement according to claim 1, wherein the means for cyclically charging and discharging the capacitance comprises:
   a comparator configured to compare the charging voltage associated with the at least one capacitance with the reference value; and
   a first switching means, controlled by the comparator, for discharging the capacitance when the charging voltage has reached the reference value.

3. The arrangement according to claim 2, wherein the first switching means comprises switches allocated to each of the plurality of capacitances, respectively, and wherein the arrangement further comprises a de-multiplexer coupled between the comparator and the first switching means, and configured to selectively activate one or more of the switches based upon the comparator and one or more control signals.

4. The arrangement according to claim 2, wherein the means for cyclically charging and discharging the at least one capacitance comprises a second switching means for selectively electrically connecting the at least one capacitance to the power supply for a charging thereof.

5. The arrangement according to claim 4, wherein the second switching means comprises switches allocated to each of the plurality of capacitances to be tested in the capacitance array, respectively.

6. The arrangement according to claim 2, further comprising an evaluating circuit coupled to the comparator, wherein the evaluating circuit is configured to perform a counting or frequency evaluation of a signal at an output of the comparator.

7. The arrangement according to claim 6, wherein the evaluating circuit comprises a counter electrically connected to the comparator output.

8. The arrangement according to claim 7, wherein the evaluating circuit further comprises:
   a memory in which a nominal count or count range is stored for the at least one capacitance to be tested; and
   a comparison means for comparing the nominal count or count range with an evaluation result provided by the counter.

9. The arrangement according to claim 1, wherein the arrangement is constructed as a BIST arrangement in an integrated circuit.

10. The arrangement according to claim 1, further comprising:
    circuitry configured to utilize the plurality of capacitances in the capacitance array in an operating mode; and
    third switching means for selectively coupling the plurality of capacitances to the circuitry in the operating mode.

11. The arrangement according to claim 10, wherein the circuitry comprises a digital-to-analog converter.

12. The arrangement according to claim 10, wherein the circuitry comprises an oscillator.

13. A method for testing a capacitance array, comprising a plurality of capacitances, comprising:
    cyclically charging and discharging at least one of the capacitances over a predetermined time period, wherein a cycle frequency of the charging and discharging is dependent on a value of the at least one capacitance and on a comparison of a charging voltage during a charging of the at least one capacitance with a reference value; and
    measuring the cycle frequency or a quantity associated therewith over the time period, and using the measurement to evaluate the capacitance value of the at least one of the capacitances.

14. The method according to claim 13, wherein the cyclical charging and discharging comprises closing a first switching means to discharge the at least one capacitance when the charging voltage has reached the reference value.

15. The method according to claim 14, wherein the first switching means comprises switches allocated to each of the plurality of capacitances to be tested in the capacitance array, respectively, the method further comprising driving the switches of the first switching means in a time-division-multiplexed fashion.

16. The method according to claim 15, wherein charging the at least one capacitance comprises selectively electrically connecting the at least one capacitance to a power supply via a second switching means, the method further comprising driving the second switching means at a multiplexing rate of the first switching means.

17. The method according to claim 13, wherein evaluating the comparison signal comprises:
   retrieving a nominal count or count range stored in a memory for the at least one capacitance to be tested; and
   comparing the nominal count or count range with a counted number of charging and discharging cycles over the predetermined time period.

18. The method according to claim 13, wherein the method comprises a BIST method.

19. The method according to claim 13, further comprising selectively coupling a circuit to the plurality of capacitances for use thereof via a third switching means, the selective coupling comprising:
   closing the third switching means associated with the at least one capacitance;
   closing a second switching means associated with the same at least one capacitance;
   opening a first switching means associated with the same at least one capacitance;
   applying a test frequency to the at least one capacitance via the closed third switching means; and
   evaluating a signal obtained via the closed second switching means.

* * * * *